(12) United States Patent
Delfs et al.

(10) Patent No.: US 10,317,531 B2
(45) Date of Patent: Jun. 11, 2019

(54) 3D LASER SCANNER

(71) Applicant: Robert Bosch GmbH, Stuttgart (DE)

(72) Inventors: Christoph Delfs, Bretten (DE); Frank Fischer, Gomaringen (DE); Reiner Schnitzer, Reutlingen (DE); Niklas Dittrich, Pliezhausen (DE); Heiko Ridderbusch, Schwieberdingen (DE); Gael Pilard, Wankheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 342 days.

(21) Appl. No.: 15/305,737

(22) PCT Filed: Mar. 26, 2015

(86) PCT No.: PCT/EP2015/056584
§ 371 (c)(1),
(2) Date: Oct. 21, 2016

(87) PCT Pub. No.: WO2015/165663
PCT Pub. Date: Nov. 5, 2015

(65) Prior Publication Data
US 2017/0052256 A1    Feb. 23, 2017

(30) Foreign Application Priority Data

Apr. 28, 2014 (DE) .................. 10 2014 207 893

(51) Int. Cl.
*G01S 17/89* (2006.01)
*G02B 26/08* (2006.01)
(Continued)

(52) U.S. Cl.
CPC ............ *G01S 17/42* (2013.01); *G01S 7/4814* (2013.01); *G01S 7/4817* (2013.01); *G01S 17/58* (2013.01);
(Continued)

(58) Field of Classification Search
CPC .......... G01S 17/42; G01S 17/58; G01S 17/89; G01S 17/4814; G01S 7/4817;
(Continued)

(56) References Cited

U.S. PATENT DOCUMENTS

2013/0293684 A1    11/2013    Becker et al.

FOREIGN PATENT DOCUMENTS

DE    112011102535 T5    7/2013
DE    102012103549 A1    10/2013
(Continued)

OTHER PUBLICATIONS

International Search Report dated Jun. 25, 2015, of the corresponding International Application PCT/EP2015/056584, filed Mar. 26, 2015.
(Continued)

*Primary Examiner* — Daniel L Murphy
(74) *Attorney, Agent, or Firm* — Norton Rose Fulbright US LLP; Gerard Messina (57) ABSTRACT

A module for measuring an object located in a position finding zone; the module being configured for generating a primary beam; the module having a scanning mirror structure; the scanning mirror structure being controllable to allow the primary beam to execute a scanning movement within the position finding zone; the module being configured to allow a secondary signal to be detected when the secondary signal is produced in response to the interaction of the primary beam with the object in a deflection position of the scanning mirror structure; the module being configured to generate position finding information as a function of the deflection position of the scanning mirror structure; the module featuring a semiconductor laser component; the
(Continued)

semiconductor laser component being configured for producing the primary beam and for detecting the secondary signal.

12 Claims, 4 Drawing Sheets

(51) Int. Cl.
  *H01S 5/183* (2006.01)
  *G01S 17/42* (2006.01)
  *G01S 17/58* (2006.01)
  *G01S 7/481* (2006.01)
  *H01S 5/14* (2006.01)
  *H01S 5/026* (2006.01)

(52) U.S. Cl.
  CPC .......... *G01S 17/89* (2013.01); *G02B 26/0833* (2013.01); *H01S 5/14* (2013.01); *H01S 5/183* (2013.01); *H01S 5/0261* (2013.01); *H01S 5/0264* (2013.01); *H01S 5/18341* (2013.01)

(58) Field of Classification Search
  CPC ....... G02B 26/0833; H01S 5/183; H01S 5/14; H01S 5/0261; H01S 5/0264; H01S 5/18341
  USPC ....................................................... 356/5.09
  See application file for complete search history.

(56) References Cited

FOREIGN PATENT DOCUMENTS

| | | |
|---|---|---|
| EP | 1950854 A1 | 7/2008 |
| EP | 2120455 A1 | 11/2009 |
| WO | 2009107013 A1 | 9/2009 |

OTHER PUBLICATIONS

Kern et al., "Monolithic VCSEL PIN Photodiode Integration for Bidirectional Optical Data Transmission", IEEE Journal of Selected Topics in Quantum Electronics, IEEE Service Center, Piscataway, NJ, US, vol. 19, No. 4, Jul. 2013, XP011508658, 13 pages.

3D LASER SCANNER

FIELD

The present invention relates to a module for a scanner.

BACKGROUND INFORMATION

Laser scanners are generally available. Laser scanners can be used for capturing a three dimensional (3D) shape of an object, for example. Such laser scanners are also referred to as 3D scanners.

SUMMARY

It is an object of the present invention to provide a module that will make possible a more compact and cost-effective 3D scanner design than the related art and, moreover, comparatively precise measurements of the object, in particular.

In accordance with example embodiments of the present invention, the module according to the present invention and the method according to the present invention for measuring an object located in a position finding zone have an advantage over the related art in that the object is measured with a relatively high precision through the use of a semiconductor laser component, and in that the module nevertheless has a relatively compact design since the semiconductor laser component is designed both for producing the primary beam, as well as for detecting the secondary signal. The semiconductor laser component is preferably a monolithic semiconductor component. This means, in particular, that a laser light source and an optical detector array are monolithically integrated in the semiconductor laser component, the optical detector array including a photodetector whose signal is preferably used for distance measurement and/or velocity measurement.

Measuring the object is to be understood, in particular as acquiring data to capture a three-dimensional form, i.e., a physical spatial geometry or shape of the object. The term "module" preferably includes a component that may be adaptively integrated into a multiplicity of different electrical devices. The object is a physical-spatial object that is located in the position finding zone, for example. The position finding information preferably refers to locating a point on a surface of the object, position finding signifying here, in particular that a positional coordinate of the point is detected on the surface of the object. The positional coordinate refers, in particular to a position of the point relative to the module and/or to a position of the point relative to a further position or a further point on the surface of the object; in particular, the point and the further point being disposed along a scan line on the surface of the object associated with the scanning movement. The secondary signal is produced, in particular in response to the interaction (reflection) of the object with the primary beam emitted in the deflection position of the scanning mirror structure. The secondary signal is, in particular the reflection signal component that is detectable by the module and that returns thereto. The semiconductor laser component is preferably a laser light source for generating the primary beam radiated into the position finding zone, the primary beam being composed of visible light and/or infrared light, for example. The scanning movement of the primary beam is preferably a line scanning and/or raster scanning movement of the primary beam, the scanning movement preferably taking place along a radiating surface. The scanning movement is preferably a periodic sweeping motion between two boundaries of the position finding zone.

The module may preferably be flexibly integrated into a multiplicity of different electrical devices in accordance with the modular design principle. The module is configured to be integrable into smart phones, tablet computers, pico projectors and/or into other portable electrical devices, for example. Advantageous embodiments and refinements of the present invention may be derived from the description herein, reference being made to the figures.

One preferred further embodiment provides that the semiconductor laser component include a Doppler sensor, the Doppler sensor being, in particular a vertical cavity surface-emitting laser (VCSEL) or a vertical external-cavity surface-emitting laser (VeCSEL).

This makes it advantageously possible to use the Doppler sensor to contactlessly detect a velocity—for example, of a projection point on the surface of the object—and/or a distance, respectively a spacing—for example, of the projection point on the surface of the object to the module. The primary beam is preferably a Gaussian beam, so that, in particular relatively simply designed collimation optics is used for the module for collimating the primary beam produced by the VCSEL. The VCSEL is preferably integrated in a multiple-wavelength laser module—i.e., a red green blue (RGB) module or infrared (IR) module or RGB IR module. A relatively low intensity secondary signal may also be advantageously detected by using the VCSEL Doppler sensor, thereby providing a module that has relatively low sensitivity to interfering background light and/or to temperature fluctuations.

Another preferred embodiment provides that the scanning mirror structure be a microelectromechanical system (MEMS).

This makes it advantageously possible for an MEMS micromirror to be used as a scanning mirror structure for deflecting the primary beam, respectively as a deflection unit, the scanning movement of the primary beam being produced by adjusting the MEMS micromirror.

Another preferred embodiment provides that the module for measuring the object be configured in a distance operating mode and/or in a velocity operating mode, the module being configured to allow image information about a three dimensional shape of the object to be generated in the distance operating mode and/or in the velocity operating mode.

This makes it advantageously possible for relatively substantial differences in height (profile variations) and/or edges along the object surface to be detected with a relatively high precision. It is especially preferred that the detection take place at very high scanning velocities, i.e., at scanning velocities associated with scanning frequencies in the kilohertz range. This makes it advantageously possible for correspondingly high Doppler frequencies to be detected relatively efficiently and quickly.

Another preferred embodiment provides that the module be configured in the distance mode to generate image information as a function of a distance detection for a distance between the module and the object, the module being configured, in particular for detecting distance as a function of the primary signal being modulated by a modulation signal.

This makes it advantageously possible for the surface (respectively shape or contour) of the object (object surface) to be three-dimensionally measured in the distance operating mode (also referred to as distance mode) in that the primary laser beam strikes, respectively illuminates a location— respectively projection point in a way that induces the secondary signal and generates the position finding information as a function of the secondary signal being detected (by the Doppler sensor), so that the position finding information includes information pertaining to a distance (distance value). The three dimensional shape of the object is preferably reconstructed by detecting a multiplicity of such distance values relative to a multiplicity of different projection points on the object surface.

Another preferred embodiment provides that the module be configured in the velocity operating mode to generate the image information as a function of a Doppler frequency of the secondary signal being detected; the module, in particular, being configured to allow the image information to be generated as a function of the Doppler frequency and of a scanning velocity of the primary beam's scanning movement.

This makes it advantageously possible, in an operating mode, in which the Doppler sensor detects a velocity of the projection point generated during the scanning movement on the object, the (moving) primary beam scanning the object surface. As a function of the lateral movement of the projection point along the contour of the object—i.e., generally orthogonally to the main direction of extent of the primary beam, the distance of the projection point to the Doppler sensor, i.e., generally parallel to the main direction of extent of the primary beam is altered in a way that allows a detection signal (measurement signal) generated as a function of the detected secondary signal to include information about the movement of the projection point along the contour of the object; the projection point movement being recorded as an effective velocity (i.e., as an effective velocity of the object relative to the module on the basis of the movement of the point along the contour of the object) (Doppler effect). The effective velocity is preferably detected as a function of a measurement of the Doppler frequency associated with the Doppler effect, so that the image information is derivable from the detection signal. In accordance with the present invention, the module is preferably configured in a way that allows a change in distance or spacing between two different projection points on the object surface to be detected as a function of the detected Doppler frequency, and the change in distance to be derived from the detection signal. The Doppler frequency is preferably dependent on a scanning velocity of the primary beam (i.e., of an angular velocity, respectively directional change rate) and on the geometry of the object surface (object geometry).

Another preferred embodiment provides that
 the module be configured for generating positional data pertaining to a module position, the module for measuring the object being configured as a function of the positional data; and/or
 the module for measuring the object being configured by feature recognition.

This makes it advantageously possible to use various methods for measuring the object. For example, the module features a microelectromechanical inertia sensor for generating the positional data.

Another object of the present invention is an electrical device having a module according to the present invention, the electrical device being a laser scanner for measuring a three dimensional shape of the object.

This makes it advantageously possible to provide an electrical device for efficiently and relatively precisely detecting structures on the object surface (for example, edges).

A preferred embodiment of the method according to the present invention provides that the module be operated in a distance operating mode and/or in a velocity operating mode in a way that allows image information about a three dimensional shape of the object to be generated, the image information being generated, in particular, as a function of the position finding information and the deflection position of the scanning mirror structure.

Another preferred embodiment of the method according to the present invention provides that distance detection be used in the distance mode to record a surface profile of the object, a modulation signal modulating the primary signal during the distance detection.

Another preferred embodiment of the method according to the present invention provides that the velocity operating mode be used to record a surface profile of the object as a function of a detection of a Doppler frequency of the secondary signal, the image information being generated as a function of the detected Doppler frequency; the image information being generated, in particular as a function of the scanning velocity of the primary beam's scanning movement.

Exemplary embodiments of the present invention are illustrated in the drawing and explained in detail in the following description.

DETAILED DESCRIPTION OF EXAMPLE EMBODIMENTS

In the various figures, the same parts are always denoted by the same reference numerals and, therefore, are also typically only named or mentioned once in each case.

Figure 1:
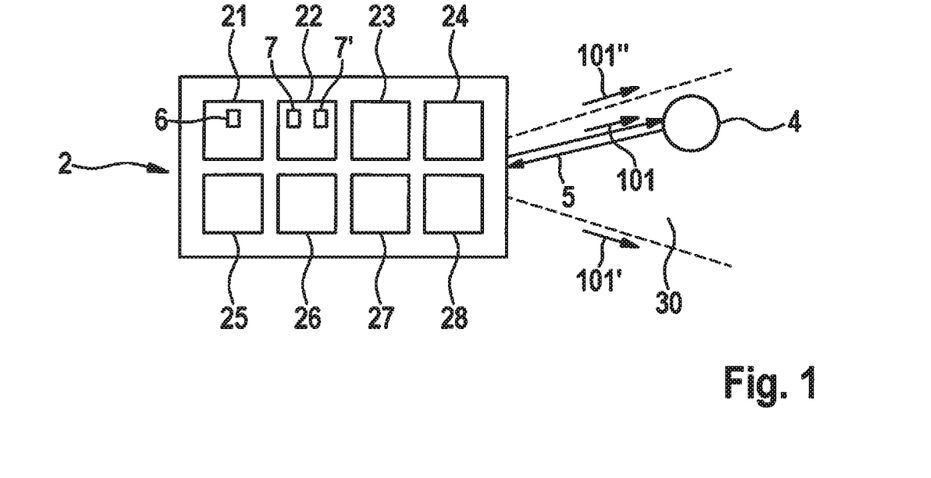
FIG. 1 through 3 show a module in accordance with different specific embodiments of the present invention in a schematic view.

In a schematic view, FIG. 1 shows a module 2 in accordance with a specific embodiment of the present invention. Module 2 is configured here for finding the position of an object 4 disposed in a radiating surface 30. Module 2 is configured to allow primary beam 3 (shown in FIG. 3) to execute a scanning movement essentially along radiating surface 30; a secondary signal 5 being detected when primary beam 3 interacts with object 4 positioned in radiating surface 30 in a way that induces secondary signal 5. For example, secondary signal 5 is generated by reflection of primary beam 3 off of object 4 when primary beam 3 is radiated in a beam direction 101 and impinges upon object 4, and, viewed from module 2, the object is positioned in radiating surface 30 in beam direction 101.

Here, finding the position of object 4 signifies positionally determining the entire object or merely a point on an object surface (for example, a projection point on a surface of object 4 generated by primary beam 3); the positional determination relating to a determination of a distance, respectively a spacing between module 2 and object 4, respectively object surface, and/or to a determination of a position of the projection point (associated with the further point on the object surface) relative to a further projection point (associated with a further point on the object surface);

the projection point and further projection point each being generated, in particular, at different points in time during the scanning movement.

Module 2 preferably features a first submodule 21, a second submodule 22, a third submodule 23, a fourth submodule 24, a fifth submodule 25, a sixth submodule 26, a seventh submodule 27, an eighth submodule 28, and/or further submodules. A module 2 having a modular design is hereby provided that is flexibly adaptable in accordance with the modular design principle, for example, to a multiplicity of different electrical devices 1 and/or applications.

In one exemplary specific embodiment of module 2, first submodule 21 is a light module 21 configured for generating primary beam 3 and/or a further primary beam 3'; and/or second submodule 22 is a scanning module 22 configured for generating a scanning movement of primary beam 3 and/or a further scanning movement of further primary beam 3'; and/or third submodule 23 is a first control module and/or detection module 23 configured for generating a detection signal as a function of secondary signal 5 and/or further secondary signal 5'; and/or fourth submodule 24 is an evaluation module 24 for generating position finding information; and/or fifth submodule 25 is a second control module and/or detection module 25; and/or sixth submodule 26 is a control module 26 for controlling a power supply; and/or seventh submodule 27 is a camera module; and/or eighth submodule 28 is a communication module 28 configured for communicating with an electrical device 1 and/or for transmitting data to electrical device 1.

Light module 21 includes a semiconductor laser component 6 (also referred to in the following as light source) for generating a primary beam 3. The light source is preferably a light-emitting diode, especially a laser diode or a surface-emitting laser, for example, a VCSEL. Primary beam 3 generated by light source 6 is, in particular a visible light beam 3—i.e., light of approximately 380 nanometers (nm) to 780 nm wavelength—or an infrared (IR) light beam.

Here, scanning module 22 features scanning mirror structure 7, 7' including microelectromechanical scanning mirror element 7. In particular, module 2 is configured to ensure that scanning mirror structure 7 deflects primary beam 3 in a way that allows it to essentially extend along (plane) radiating surface 30. Micromechanical scanning mirror element 7 is adjustable in a plurality of deflection positions within a range between two maximum deflection positions (of scanning mirror element 7, respectively of further scanning mirror element 7'). In a first maximum deflection position of the two maximum deflection positions, primary beam 3 is radiated by scanning mirror structure 7 in a first beam direction 101' along radiating surface 30. In a second maximum deflection position of the two maximum deflection positions, primary beam 3 is radiated by scanning mirror structure 7 in a second beam direction 101' along radiating surface 30. First beam direction 101' and second beam direction 101'' define boundaries 101, 101'' of position finding zone 30. In this specific embodiment, the terms position finding zone 30 and radiating surface 30, in particular have the same meaning. Micromechanical scanning mirror element 7 is especially configured to execute a deflection movement between the two maximum deflection positions in response to a control signal acting upon scanning mirror element 7. Primary beam 3 is especially a laser beam 3.

In particular, primary beam 3 is moved during the scanning movement with a scanning frequency; the scanning frequency being associated with a scanning period of the scanning movement. In particular, primary beam 3 is scanned, respectively swept during the scanning period from first position finding boundary 101' (represented by a primary beam having reference numeral 3') to second position finding boundary 101'' (represented by a primary beam having reference numeral 3'') and back again to first position finding boundary 101'. The scanning frequency is, in particular between 1 Hertz (Hz) and 100 kilohertz (kHz), especially between 1 Hz and 50 kHz, especially between 1 Hz and 30 kHz.

Primary beam 3 is radiated in a deflection direction 101 in a deflection position within a range between two maximum deflection positions of scanning mirror element 7. If an object 4—for example, a finger 4 of a user—is placed or positioned in radiating surface 30 in such a way that object 4 touches or intersects radiating surface 30, secondary signal 5 is produced in response to the interaction—i.e., for example, reflection—of primary beam 3 with object 4. For example, object 4 is moved into radiating surface 30 along a projection direction 103 disposed orthogonally thereto, so that object 4 is placed or positioned in radiating surface 30. Here, secondary signal 5 is produced in response to primary beam 3 being radiated (during the scanning movement) in beam direction 101.

Here, light source 6 is configured both for generating primary beam 3, as well as for detecting secondary signal 3 (i.e., light source 6 includes an optical detection element that is monolithically integrated with the light source). Light source 6 is preferably a VCSEL. Module 2 is preferably configured to produce a detection signal in response to secondary signal 5 detected by the optical detection element. In particular, module 2 is configured to produce position finding information in response to the detection signal. Module 2 is preferably configured to produce a position detection signal indicative of a deflection position of scanning mirror element 7 and/or of a further deflection position of further scanning mirror element 7' during detection of secondary signal 5 in a way that allows the position finding information to be produced in a time-resolved manner in response to the detection signal and the position detection signal. In particular, the position finding information includes distance information pertaining to a distance of object 4 to module 2, and/or orientation information pertaining to an orientation direction of object 4 relative to module 2, and/or a positional coordinate indicative of a position of a projection point on the surface of object 4.

Figure 2:
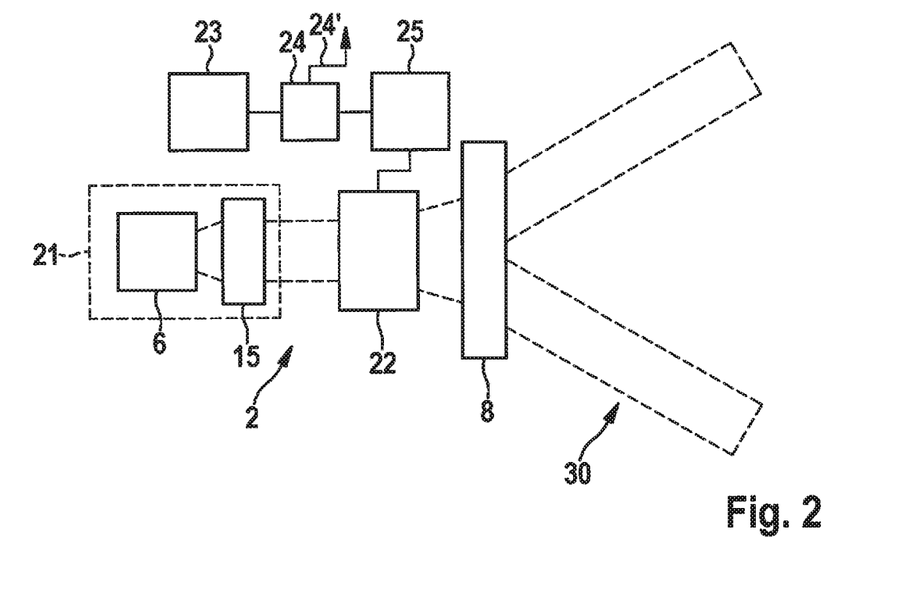

FIG. 2 shows a module 2 in accordance with a specific embodiment of the present invention. The specific embodiment shown here essentially corresponds to the specific embodiment described in FIG. 1. Here, module 2 features first submodule 21, second submodule 22, third submodule 23, fourth submodule 24, and fifth submodule 25.

First submodule 21 (light module) has a light source 6 and a collimating optics 15. Here, light source 6 is a (VCSEL or VeCSEL) Doppler sensor; the Doppler sensor being configured to allow a primary beam 3 (see, for example, FIG. 2) to be transmitted to second submodule 22 (MEMS scanning module). The primary beam is an infrared (IR) laser beam, for example. Here, second submodule 22 includes a scanning mirror structure 7, 7' having at least one MEMS scanning mirror element 7. In another specific embodiment, the scanning mirror structure includes another mirror element 7'. Scanning mirror structure 7, 7' is preferably adjustable—i.e., a position of the at least one MEMS scanning mirror element 7 is variable and detectable by a position detection sensor element (not shown here). Module 2 preferably has a wide-angle optics 8 (for example, a lens optics or an—in particular cylindrical—concave mirror structure or convex mirror structure). Doppler sensor 6 is preferably electroconductively connected to a third submodule 23 (first control module and/or detection module) of module 2; third submodule 23 being configured, in particular for controlling Doppler sensor 6 and/or for generating a detection signal in response to Doppler sensor 6 detecting the secondary signal. Scanning module 22 is preferably electroconductively connected to a fifth submodule 25 (second control module and/or detection module) of module 2; fifth submodule 25 being configured, in particular for controlling and/or generating a positional detection signal (in response to a detection of a position of MEMS mirror element 7), allowing the positional detection signal to include information about an angular position of scanning mirror element 7. Module 2 preferably has a fourth submodule 24 (evaluation module); evaluation module 24, in particular being configured to allow position finding information—in particular about a distance and/or velocity of a projection point 4' on the object surface—to be determined as a function of the detection signal and the positional detection signal (in a time-resolved manner)—i.e., in particular uniquely associated with an angular position. The position finding information (i.e., an evaluated positional signal, in particular a raw data signal that includes image information about the measured three-dimensional shape of object 4) is preferably transmitted via an interface 24' of module 2 to an application processor (not shown here). The application processor is preferably integrated in module 2, or is an application processor of an electrical device (in which module 2 is integrated), or is another external electrical device. In particular, third, fourth and fifth submodules 23, 24, 25 are integrated in the same circuit or are separate circuit elements.

Figure 3:
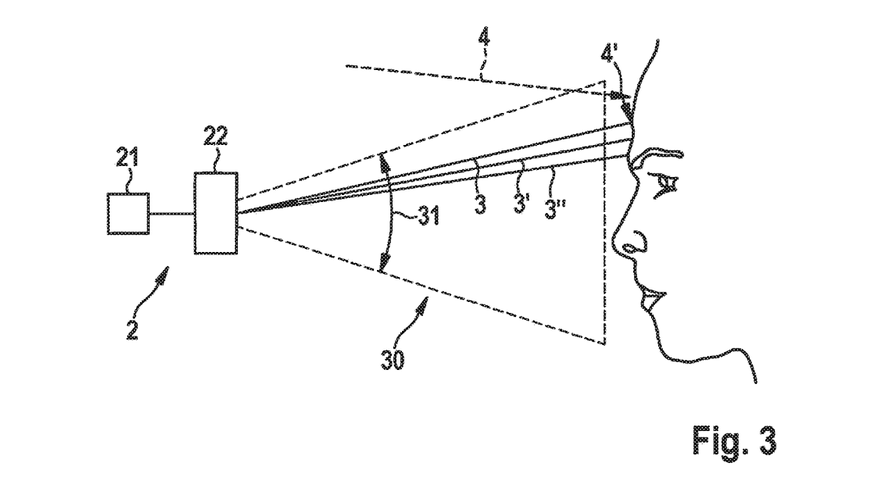

FIG. 3 shows a module 2 in accordance with a specific embodiment of the present invention. A method according to the present invention for operating module 2 is described in the following with reference to FIG. 3.

In a first operating step, semiconductor laser component 6 (VCSEL or VeCSEL Doppler sensor) of first submodule 21 produces primary beam 3; primary beam 3 being directed to scanning mirror structure 7, 7' of second submodule 22. In a second operating step, scanning mirror structure 7, 7' is adjusted or controlled to allow primary beam 3 to execute a scanning movement within position finding zone 30. In particular, scanning mirror structure 7, 7' includes MEMS scanning mirror element 7; MEMS scanning mirror element 7 either being a one-dimensional scanning mirror element 7—i.e., a scanning mirror element 7 configured for generating a single-line scanning movement—or a two-dimensional scanning mirror element 7—i.e., a scanning mirror element 7 configured for (successively) scanning the (entire) surface of object 4. In a third operating step, in a deflection position of scanning mirror structure 7, 7', semiconductor laser component 6 detects a secondary signal 5 in response to primary beam 3 interacting with object 4 in the deflection position of scanning mirror structure 7, 7'. FIG. 3 shows primary beam 3 at different angular positions (deflection positions of scanning mirror structure 7, 7') during the scanning movement. In this case, the primary beam strikes different points on the surface of object 4 (here, a face) at different points in time during the scanning movement, so that a spacing or a distance between the point and Doppler module 6 is associated with each point on the object surface. In a fourth operating step, position finding information is produced as a function of secondary signal 5 that is detected (in a time-resolved manner). For each projection point 4', the distance between projection point 4' and Doppler sensor 6 is preferably determined in the distance operating mode of module 2 and/or in the velocity operating mode of module 2. It is also preferred that a movement of object 4 be detected along a connecting line between module 2 and object 4 when a projection point velocity along the surface of object 4 (surface velocity) is detected within a time period shorter than a frequency period for the scanning movement.

Figure 4:
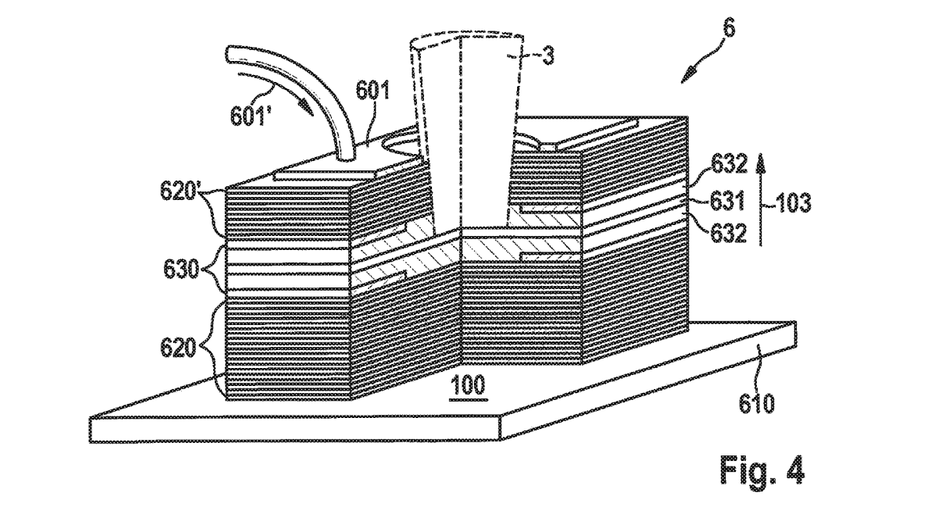
FIG. 4 through 7 show a semiconductor laser component of a module in accordance with different specific embodiments of the present invention in a schematic view.

FIG. 4 shows a schematic view of a semiconductor laser component 6 of a module 2 in accordance with various specific embodiments of the present invention. Here, semiconductor laser component 6—preferably a Doppler sensor—is a surface-emitting laser having a vertical cavity (vertical-cavity surface-emitting laser—VCSEL). Here, semiconductor laser component 6 is placed on a substrate 610. Semiconductor laser component 6 has, in particular a layer-type structure along a normal direction 103 that is disposed orthogonally to a main extension plane 100 of substrate 610, semiconductor laser component 6 including a mirror layer 620 (i.e., a bottom mirror element having a reflectivity of more than 99.9 percent) applied to substrate 610, another mirror layer 620' (i.e., a top mirror element having a reflectivity of approximately 99 percent), and a resonator layer 630 (i.e., an optical resonator or a laser cavity) disposed between mirror layer 620 and further mirror layer 620', resonator layer 630, in particular, extending along normal direction 103 along a layer thickness, layer thickness essentially being equal to a wavelength of primary beam 3. Here, resonator layer 630 features a reinforcing element 631; reinforcing element 631 being disposed between two oxide layers 632 of resonator layer 630. Semiconductor component 6 is configured for producing primary beam 3; primary beam 3 here being a laser beam 3; laser beam 3, in particular featuring visible light or infrared light. Here, semiconductor laser component 6 is a contact means 601 for electroconductively contacting semiconductor laser component 6; the semiconductor laser component being controllable in response to an injection current signal 601'.

Figure 5:
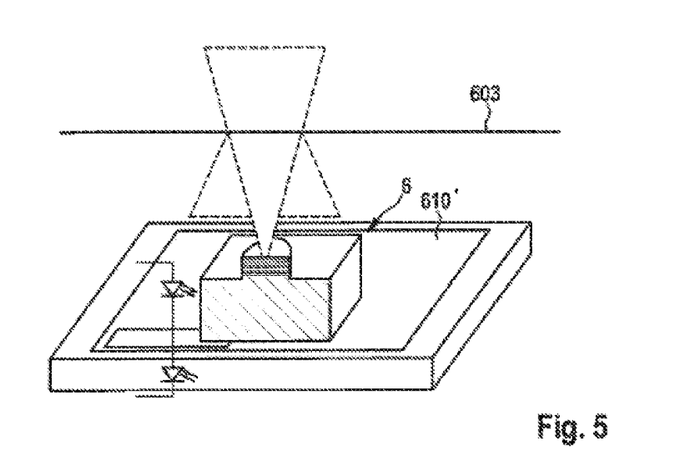
Figure 6:
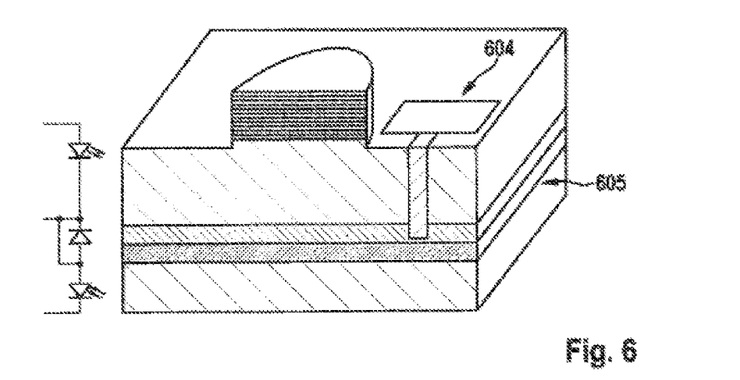
Figure 7:
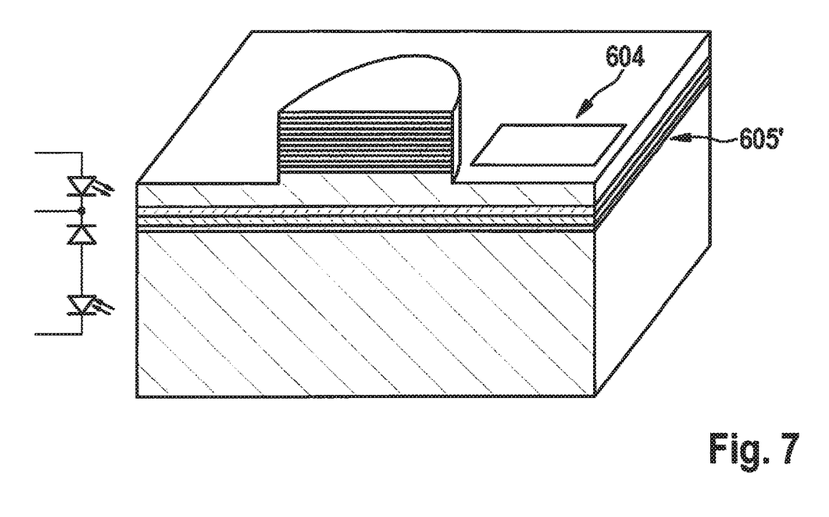

FIG. 5 through 7 show a schematic view of a semiconductor laser component 6 of a module 2 in accordance with various specific embodiments of the present invention; here, semiconductor laser component 6 being configured as a VCSEL Doppler sensor. Basically, at least three implementation options (in particular, that may be combined with one another) for detecting secondary signal 5 are shown (power detection). In accordance with one first detection variant (see FIG. 5), the detection signal is produced by power detection outside of optical resonator 630 in response to a reflection or absorption. In accordance with a second detection variant (see FIG. 6), the detection signal is produced by power detection outside of optical resonator 630 in response to an emission by a bottom of semiconductor component 6 (bottom emission). In accordance with a third detection variant (see FIG. 7), the detection signal is produced by power detection within optical resonator 630 in response to absorption losses. FIG. 5 illustrates a detection in accordance with the first detection variant, a silicon photodetector 610' outside of semiconductor laser component 6 detecting a light signal reflected off of a cover element 603. FIG. 6 illustrates a detection in accordance with the second detection variant; here, semiconductor laser component 6 having an n-doped internal contact means 604 (intracavity contact) and an external contact means 605 (extracavity—photodiode contact) for contacting a photodiode integrated in semiconductor laser component 6; the integrated photodiode being disposed here between the optical resonator (i.e., externally) and the substrate of semiconductor laser component 6. FIG. 7 illustrates a detection in accordance with the third detection variant; here, semiconductor laser component 6 having an n-doped internal contact means 604 (intracavity contact) and another contact means 605' (here, an intracavity—photodiode contact) for contacting a photodiode integrated in semiconductor laser component 6; the integrated photodiode here being a photodiode integrated, in particular, with optical resonator 630.

What is claimed is:

1. A module for measuring an object located in a position finding zone, the module being configured for generating a primary beam, the module including a scanning mirror structure which is controllable to allow the primary beam to execute a scanning movement within the position finding zone, the module being configured to allow a secondary signal to be detected when the secondary signal is produced in response to an interaction of the primary beam with the object in a deflection position of the scanning mirror structure, the module being configured to generate position finding information as a function of the deflection position of the scanning mirror structure, wherein the module includes a semiconductor laser component, the semiconductor laser component being configured for producing the primary beam and for detecting the secondary signal.

2. The module as recited in claim 1, wherein the semiconductor laser component is a Doppler sensor, the Doppler sensor being a vertical cavity surface-emitting laser (VCSEL) or a vertical external-cavity surface-emitting laser (VeCSEL).

3. The module as recited in claim 1, wherein the scanning mirror structure is a microelectromechanical system (MEMS).

4. The module as recited in claim 1, wherein the module is configured at least one of in a distance operating mode and in a velocity operating mode, the module being configured to allow image information about a three dimensional shape of the object to be generated at least one of in the distance operating mode and in the velocity operating mode.

5. The module as recited in claim 4, wherein the module is configured in the distance mode to generate image information as a function of a distance detection for a distance between the module and the object, the module being configured for detecting distance as a function of the primary signal being modulated by a modulation signal.

6. The module as recited in claim 4, wherein the module is configured in the velocity operating mode to generate image information as a function of a frequency detection of a Doppler frequency of the secondary signal, the module being configured to allow the image information to be generated as a function of the Doppler frequency and of a scanning velocity of the scanning movement of the primary beam.

7. The module as recited in claim 1, wherein at least one of:
the module is configured for generating positional data relating to a position of the module, the module for measuring the object being configured as a function of the positional data, and
the module for measuring the object is configured by feature recognition.

8. An electrical device, comprising:
a module for measuring an object located in a position finding zone, the module being configured for generating a primary beam, the module including a scanning mirror structure which is controllable to allow the primary beam to execute a scanning movement within the position finding zone, the module being configured to allow a secondary signal to be detected when the secondary signal is produced in response to an interaction of the primary beam with the object in a deflection position of the scanning mirror structure, the module being configured to generate position finding information as a function of the deflection position of the scanning mirror structure, wherein the module includes a semiconductor laser component, the semiconductor laser component being configured for producing the primary beam and for detecting the secondary signal;
wherein the electrical device is a laser scanner for measuring the object with regard to a three dimensional shape thereof.

9. A method for operating a module, the module for measuring an object located in a position finding zone, the module being configured for generating a primary beam, the module including a scanning mirror structure which is controllable to allow the primary beam to execute a scanning movement within the position finding zone, the module being configured to allow a secondary signal to be detected when the secondary signal is produced in response to an interaction of the primary beam with the object in a deflection position of the scanning mirror structure, the module being configured to generate position finding information as a function of the deflection position of the scanning mirror structure, wherein the module includes a semiconductor laser component, the semiconductor laser component being configured for producing the primary beam and for detecting the secondary signal, the method comprising:
producing, by the semiconductor laser component, the primary beam, the primary beam being directed to the scanning mirror structure;
controlling the scanning mirror structure to allow the primary beam to execute a scanning movement within the position finding zone;
detecting, by the semiconductor laser component, a secondary signal in a deflection position of the scanning mirror structure in response to the primary beam interacting with the object in the deflection position of the scanning mirror structure; and
producing position finding information as a function of the detected secondary signal.

10. The method as recited in claim 9, wherein the module is operated one of in a distance operating mode and in a velocity operating mode in a way that allows image information to be generated about a three dimensional shape of the object, the image information being generated as a function of the position finding information and the deflection position of the scanning mirror structure.

11. The method as recited in claim 10, wherein, in the distance mode, distance detection is used to record a surface profile of the object, a modulation signal modulating the primary signal during the distance detection.

12. The method as recited in claim 10, wherein, in the velocity operating mode, a surface profile of the object is recorded as a function of a detection of a Doppler frequency of the secondary signal, the image information being generated as a function of the detected Doppler frequency, and the image information being generated as a function of a scanning velocity of the scanning movement of the primary beam.

\* \* \* \* \*